(12) United States Patent
Dewey et al.

(10) Patent No.: US 11,145,739 B2
(45) Date of Patent: Oct. 12, 2021

(54) FIELD EFFECT TRANSISTORS WITH A GATED OXIDE SEMICONDUCTOR SOURCE/DRAIN SPACER

(71) Applicant: Intel Corporation, Santa Clara, CA (US)

(72) Inventors: Gilbert W. Dewey, Beaverton, OR (US); Rafael Rios, Austin, TX (US); Van H. Le, Portland, OR (US); Jack T. Kavalieros, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 688 days.

(21) Appl. No.: 16/075,953

(22) PCT Filed: Mar. 4, 2016

(86) PCT No.: PCT/US2016/021039
§ 371 (c)(1),
(2) Date: Aug. 6, 2018

(87) PCT Pub. No.: WO2017/151148
PCT Pub. Date: Sep. 8, 2017

(65) Prior Publication Data
US 2021/0193814 A1 Jun. 24, 2021

(51) Int. Cl.
*H01L 29/49* (2006.01)
*H01L 29/66* (2006.01)
(Continued)

(52) U.S. Cl.
CPC ...... *H01L 29/4983* (2013.01); *H01L 21/0262* (2013.01); *H01L 21/02565* (2013.01);
(Continued)

(58) Field of Classification Search
CPC ............... H01L 29/4983; H01L 29/267; H01L 29/66795; H01L 29/785–7851;
(Continued)

(56) References Cited

U.S. PATENT DOCUMENTS 5,064,776 A * 11/1991 Roberts ................. H01L 21/743
438/304
5,710,054 A * 1/1998 Gardner .............. H01L 21/2256
438/304
(Continued)

FOREIGN PATENT DOCUMENTS

JP 2007012824 1/2007

OTHER PUBLICATIONS

International Search Report and Written Opinion for International Patent Application No. PCT/US16/21039, dated Nov. 18, 2016.
International Preliminary Report on Patentability dated Sep. 13, 2018 for PCT Patent Application No. PCT/US16/21039.
(Continued)

*Primary Examiner* — Errol V Fernandes
*Assistant Examiner* — Jeremy J Joy
(74) *Attorney, Agent, or Firm* — Green, Howard & Mughal LLP

(57) ABSTRACT

FETs including a gated oxide semiconductor spacer interfacing with a channel semiconductor. Transistors may incorporate a non-oxide channel semiconductor, and one or more oxide semiconductors disposed proximal to the transistor gate electrode and the source/drain semiconductor, or source/drain contact metal. In advantageous embodiments, the oxide semiconductor is to be gated by a voltage applied to the gate electrode (i.e., gate voltage) so as to switch the oxide semiconductor between insulating and semiconducting states in conjunction with gating the transistor's non-oxide channel semiconductor between on and off states.

24 Claims, 12 Drawing Sheets

(51) Int. Cl.
- *H01L 29/417* (2006.01)
- *H01L 21/8234* (2006.01)
- *H01L 21/02* (2006.01)
- *H01L 27/092* (2006.01)
- *H01L 21/465* (2006.01)
- *H01L 29/267* (2006.01)

(52) U.S. Cl.
CPC .... *H01L 21/465* (2013.01); *H01L 21/823468* (2013.01); *H01L 27/0924* (2013.01); *H01L 29/267* (2013.01); *H01L 29/41783* (2013.01); *H01L 29/41791* (2013.01); *H01L 29/6656* (2013.01); *H01L 29/66969* (2013.01)

(58) Field of Classification Search
CPC ........... H01L 29/41791; H01L 29/6656; H01L 29/517; H01L 29/41783; H01L 21/02565; H01L 21/823821; H01L 21/824431; H01L 21/823468; H01L 21/823864; H01L 27/1211; H01L 27/0886; H01L 27/0924
See application file for complete search history.

(56) References Cited

U.S. PATENT DOCUMENTS

| | | | |
|---|---|---|---|
| 5,824,586 A * | 10/1998 | Wollesen | H01L 29/665 438/300 |
| 6,180,477 B1 * | 1/2001 | Liao | H01L 21/28518 257/E21.165 |
| 6,727,534 B1 * | 4/2004 | Buller | H01L 29/42376 257/288 |
| 2003/0127695 A1 * | 7/2003 | Ozawa | H01L 29/4983 257/382 |
| 2003/0170969 A1 * | 9/2003 | Ishida | H01L 29/6656 438/596 |
| 2004/0217392 A1 | 11/2004 | Mathew et al. | |
| 2008/0206935 A1 | 8/2008 | Jang et al. | |
| 2013/0009217 A1 | 1/2013 | Yin et al. | |
| 2013/0095629 A1 | 4/2013 | Ando et al. | |
| 2013/0161706 A1 | 6/2013 | Ning et al. | |

OTHER PUBLICATIONS

Office Action from Taiwan Patent Application No. 106101822 dated Jun. 18, 2020, 16 pgs.

* cited by examiner

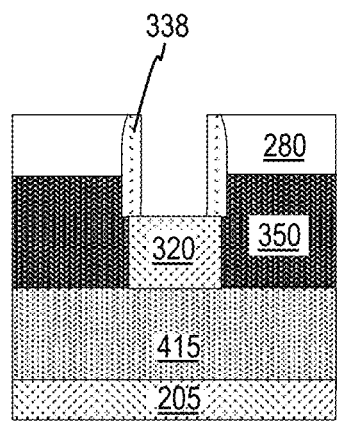
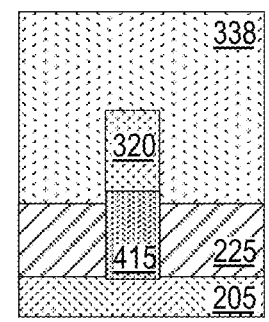
FIG. 11A    FIG. 11B
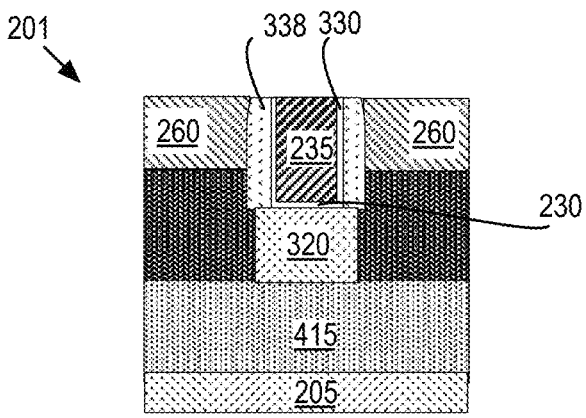
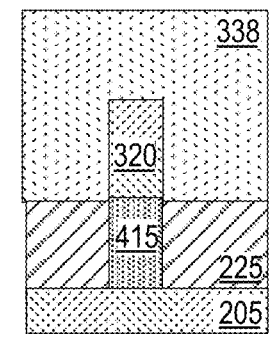
FIG. 12A    FIG. 12B

FIELD EFFECT TRANSISTORS WITH A GATED OXIDE SEMICONDUCTOR SOURCE/DRAIN SPACER

CLAIM OF PRIORITY

This Application is a National Stage Entry of, and claims priority to, PCT Application No. PCT/US16/21039, filed on 4 Mar. 2016 and titled "FIELD EFFECT TRANSISTORS WITH A GATED OXIDE SEMICONDUCTOR SOURCE/DRAIN SPACER", which is incorporated by reference in its entirety for all purposes.

BACKGROUND

Field effect transistor (FET) channel length is a function of a (lateral) dimension of a gate electrode. As dimensions of the gate electrode continue to shrink, external on-state resistance associated with the dimension of semiconductor between the channel and the source/drain that is typically underlying a dielectric spacer disposed between a gate electrode and a semiconductor source/drain becomes more significant. Attempts to scale the lateral dimension of the dielectric material (e.g., below 3-5 nm) to reduce on-state resistance often detrimentally increase the transistor off-state leakage current ($I_{off}$) and/or increase parasitic capacitances, such as between the gate electrode and the source/drain. Parasitic capacitances limit transistor-switching frequency for a given drive current. Increases in $I_{off}$ leakage between source and drain that are also associated with reductions in source/drain spacing may also pose a significant power consumption problem for an IC that includes many millions, or billions, of transistors.

Transistor architectures and associated manufacturing techniques that reduce on-state resistance, and/or $I_{off}$ leakage, and or parasitic capacitances may therefor be advantageous.

BRIEF DESCRIPTION OF THE DRAWINGS

The material described herein is illustrated by way of example, and not by way of limitation, in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures:

FIGS. 8A, 9A, 10A, 11A, and 12A illustrate cross-sectional views through a length of the channel semiconductor and source/drain semiconductor of a finFET evolving as the method illustrated in FIG. 7 is performed, in accordance with some embodiments;

FIGS. 8B, 9B, 10B, 11B, and 12B illustrate cross-sectional views through a width of a fin structure within an oxide semiconductor portion of a finFET evolving as the method illustrated in FIG. 7 is performed, in accordance with some embodiments;

DETAILED DESCRIPTION

Figure 1:
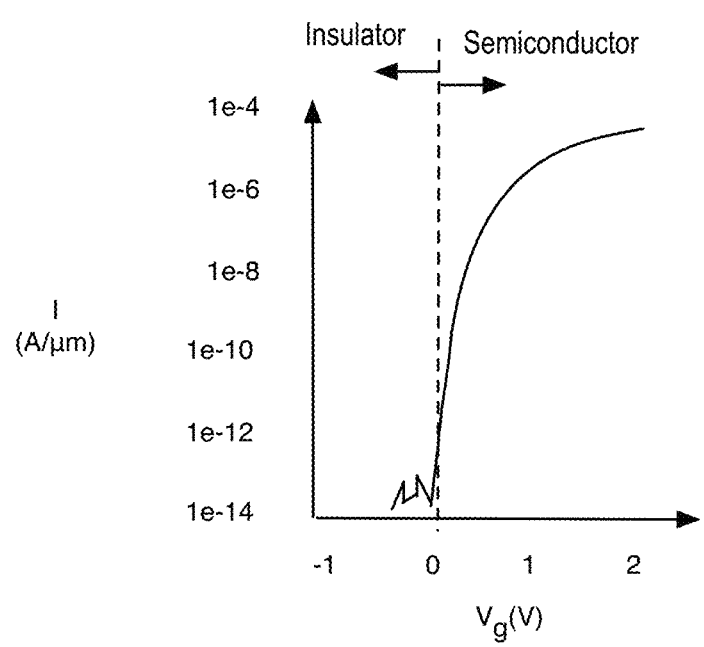
FIG. 1 is a graph illustrating a transition between insulator and conductor states for an oxide semiconductor as a function of an applied gate electrode bias voltage, in accordance with some embodiments.

One or more embodiments are described with reference to the enclosed figures. While specific configurations and arrangements are depicted and discussed in detail, it should be understood that this is done for illustrative purposes only. Persons skilled in the relevant art will recognize that other configurations and arrangements are possible without departing from the spirit and scope of the description. It will be apparent to those skilled in the relevant art that techniques and/or arrangements described herein may be employed in a variety of other systems and applications other than what is described in detail herein.

Reference is made in the following detailed description to the accompanying drawings, which form a part hereof and illustrate exemplary embodiments. Further, it is to be understood that other embodiments may be utilized and structural and/or logical changes may be made without departing from the scope of claimed subject matter. It should also be noted that directions and references, for example, up, down, top, bottom, and so on, may be used merely to facilitate the description of features in the drawings. Therefore, the following detailed description is not to be taken in a limiting sense and the scope of claimed subject matter is defined solely by the appended claims and their equivalents.

In the following description, numerous details are set forth. However, it will be apparent to one skilled in the art, that embodiments may be practiced without these specific details. In some instances, well-known methods and devices are shown in block diagram form, rather than in detail, to avoid obscuring the embodiments. Reference throughout this specification to "an embodiment" or "one embodiment" or "some embodiments" means that a particular feature, structure, function, or characteristic described in connection with the embodiment is included in at least one embodiment. Thus, the appearances of the phrase "in an embodiment" or "in one embodiment" or "some embodiments" in various places throughout this specification are not necessarily referring to the same embodiment. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description and the appended claims, the singular forms "a", "an" and "the" are intended to include the plural forms as well, unless the context clearly indicates otherwise. It will be also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause an effect relationship).

The terms "over," "under," "between," and "on" as used herein refer to a relative position of one component or material with respect to other components or materials where such physical relationships are noteworthy. For example in the context of materials, one material or material disposed over or under another may be directly in contact or may have one or more intervening materials. Moreover, one material disposed between two materials or materials may be directly in contact with the two layers or may have one or more intervening layers. In contrast, a first material or material "on" a second material or material is in direct contact with that second material/material. Similar distinctions are to be made in the context of component assemblies.

As used throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C.

Described herein are transistors incorporating a monocrystalline, non-oxide channel semiconductor, and one or more oxide semiconductors disposed proximal to the transistor gate electrode and the source/drain semiconductor, or source/drain contact metal. In advantageous embodiments, the oxide semiconductor is to be gated by a voltage applied to the gate electrode (i.e., gate voltage) so as to switch the oxide semiconductor between insulating and semiconducting states in conjunction with gating the transistor's non-oxide channel semiconductor between on and off states. When in the insulating state, the oxide semiconductor is to have a low intrinsic charge carrier density such that it functions substantially as a conventional dielectric spacer separating the gate electrode from the source and/or drain. When in the semiconducting state, the oxide semiconductor is to have a high charge carrier density, and may conduct charge carriers, for example between the channel semiconductor and the source/drain. In some embodiments where the gated oxide semiconductor is disposed in a region between the channel semiconductor and source/drain semiconductor, modulation of the charge carrier density within the oxide semiconductor may modulate the effective transistor gate length ($L_g$) between a larger gate length for a transistor off-state ($L_{g,\ off}$) and a shorter gate length for a transistor on-state ($L_{g,\ on}$). In some embodiments, gating of the oxide semiconductor may function to actively modulate the transistor gate length in a manner that provides the transistor with a combination of low on-state resistance and low off-state leakage and capacitance otherwise unachievable with a conventional passive dielectric spacer (e.g., silicon dioxide and/or silicon nitride, etc.). As such, a transistor with a gated oxide semiconductor spacer in accordance with some embodiments may have lower off-state leakage and/or parasitic capacitance than a reference silicon FET that has an $L_g$ equal to $L_{g,\ on}$. Alternatively, a transistor with a gated oxide semiconductor spacer in accordance with some embodiments may have lower on-state resistance than a reference silicon FET that has an $L_g$ equal to $L_{g,\ off}$.

Many oxide semiconductors have been studied, initially in the context of discrete rectifiers, and more recently in the context of transparent thin film transistors (TFTs) for display applications. In some embodiments, the semiconductor oxide employed in devices described herein has some level of microstructural ordering (e.g., nanocrystallinity in one or more dimensions). In other embodiments the oxide semiconductor employed in devices described herein are amorphous. In some exemplary embodiments, the oxide semiconductor is a metal oxide including a transition metal (e.g., IUPAC group 4-10) or post-transition metal (e.g., IUPAC groups 11-14). In advantageous embodiments, the metal oxide includes at least one of Cu, Zn, Sn, Ti, Ni, Ga, In, Sr, Cr, Co, V, or Mo. The metal oxide may be a suboxide ($A_2O$) monoxide (AO), binary oxide ($AO_2$), ternary oxide ($ABO_3$), and mixture thereof.

Oxide semiconductors may be n-type or p-type. A number of oxide semiconductors have been found to be capable of significant electron densities. Some oxide semiconductors have also been found to be capable of significant electron hole densities. FIG. 1 is a graph illustrating a transition between insulator and conductor states for an exemplary n-type oxide semiconductor as a function of an applied gate electrode bias voltage, in accordance with some embodiments. As shown in FIG. 1, electron current for a film of $InGaO_3(ZnO)_5$, often referred to a simply IGZO, increases from below $1e^{-14}$ amps/µm (which was the detection limit for this measurement) at 0V gate bias to over 1e' amps/µm at 1V. A device of larger dimensions, and/or more a sensitive measurement would likely reveal the current in the insulator state to be below $1e^{-20}$ amps/µm at 0V gate bias. Within the region between 0V and 1V in FIG. 1, the IGZO film carrier density increases dramatically and the material transitions from insulator to semiconductor. A similar trend can be found for p-type oxide semiconductors, where electron hole current increases as gate voltage becomes more negative. Along with conductivity type, the transition voltage (e.g., threshold voltage) of the oxide semiconductor may be tuned as a function of the oxide semiconductor composition. For example, although not bound by theory, the basis for n-type conductivity in many oxide semiconductors may be the presence of oxygen vacancies. The presence of other electrically active dopants, such as hydrogen, or one or more metal species, may also serve as a means of tuning the semiconducting properties of the oxide semiconductor.

Rather than employing an oxide semiconductor as the exclusive channel semiconductor, for example as in a TFT, embodiments described herein leverage the insulator-semiconductor state transition depicted in FIG. 1 as a means of actively modulating the gate length of a FET that further includes a gated non-oxide semiconductor channel, such as a group IV (e.g., Si, Ge, SiGe), or group III-V (e.g., GaAs, InGaAs, InAs, InP) semiconductor. In accordance with some exemplary embodiments, an oxide semiconductor is physically located relative to the FET gate electrode, the non-oxide channel semiconductor, and the source/drain semiconductor such that modulation of the carrier conduction between the source/drain semiconductor and the channel semiconductor also modulates conductivity of the oxide semiconductor. As a positive bias voltage increases the conductivity of an n-type oxide semiconductor, charge carrier density in the oxide semiconductor varies in direct correspondence with the positive bias voltage required to turn on an enhancement mode NMOS FET. Hence, in the presence of a positive gate voltage during a FET on-state, the oxide semiconductor may promote carrier conduction between the source/drain semiconductor and the channel semiconductor, reducing the effective gate length of the FET and reducing on-state resistance. In the absence of a positive gate voltage during the NMOS enhancement mode FET off-state, the oxide semiconductor does not support carrier conduction, for example between the source/drain semiconductor and the channel semiconductor, increasing the effective gate length of the FET, reducing off-state leakage, and reducing parasitic off-state capacitance.

In some embodiments described further below, monolithic FETs include a channel of a first semiconductor material. A gate electrode is disposed over the channel semiconductor. An oxide semiconductor spacer is disposed along a side of the gate electrode, or gate stack including a gate electrode layer. In some further embodiments, source/drain semiconductors are adjacent to the channel semiconductor and spaced apart from the gate electrode by a gate electrode sidewall spacer that includes an oxide semiconductor. Charge carriers traversing a shortest path between the source and drain may traverse the oxide semiconductor spacer when the carrier density within the oxide semiconductor is made sufficiently high by the gate electrode bias present during the transistor on-state. In some embodiments described further below, the oxide semiconductor gate sidewall spacer may be formed prior to growth of a raised source/drain so that the oxide semiconductor forms an interface with both the raised source/drain and the channel semiconductor.

Figure 2:
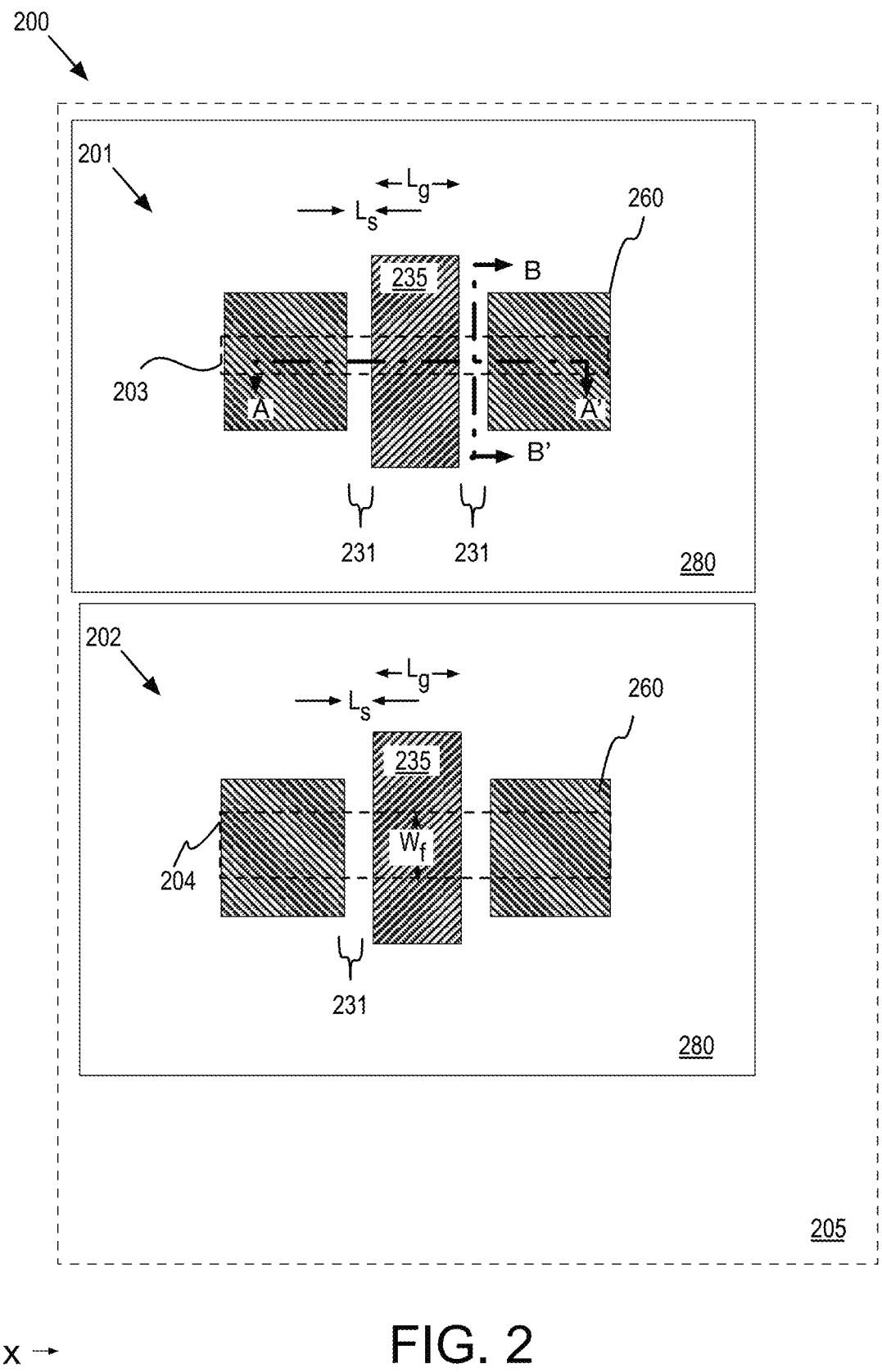
FIG. 2 is a plan view of a pair of FETs disposed over a substrate, in accordance with some embodiments.

FIG. 2 is a plan view of complementary metal-oxide-semiconductor (CMOS) circuitry 200 including an NMOS FET 201 and a PMOS FET 202 disposed over a substrate 205 and surrounded by an isolation material 280. In some embodiments, PMOS FET 202 may have any architecture while NMOS FET 201 has one or more of the oxide semiconductor structures described further below. In alternate embodiments, each of NMOS FET 201 and PMOS FET 202 include one or more of the oxide semiconductor structures described further below with the conductivity type of the oxide semiconductor for PMOS FET 202 being complementary (e.g., p-type) to that of NMOS FET 201. Substrate 205 may be any suitable carrier, which may include one or more materials upon which the non-oxide semiconductor of the FETs was formed (e.g., monocrystalline silicon, silicon-germanium, etc.), or one or more other materials upon which the FETs were transferred (e.g., one or more additional strata of FETs, a polymer sheet, etc.). Isolation material 280 may be any material suitable for providing electrical isolation between FETs 201, 202. In some exemplary embodiments, isolation material 280 is silicon dioxide. Other materials known to be suitable for the purpose may also be utilized, including low-k materials (e.g., having a relative dielectric constant below 4.0).

FETs 201, 202 are each associated with a gate length $L_g$ and a lateral spacing $L_s$ between source/drain contact metallization 260 and an edge of gate electrode 235. For at least NMOS FET 201, an oxide semiconductor is disposed at least within lateral spacing $L_s$, offsetting the source/drain contact metallization 260 and/or underlying source/drain semiconductor from channel semiconductor underlying gate electrode 235. One or more of the thickness, composition, and microstructure of this oxide semiconductor may be tuned to have a desired conductivity/voltage response. In some further embodiments, NMOS FET 201 includes a first oxide semiconductor (e.g., n-type) disposed at least within lateral spacing $L_s$ while PMOS FET 202 includes a second oxide semiconductor (e.g., p-type) disposed at least within lateral spacing $L_s$.

Although specific dimensions vary with fabrication technology generations, in one example where $L_g$ is 2-5 nm, an oxide semiconductor may occupy a majority of a 2-10 nm lateral spacing $L_s$. Also present within lateral spacing $L_s$ is one or more dielectric materials disposed between the oxide semiconductor and the gate electrode. The gate electrode is capacitively coupled to the oxide semiconductor through this intervening dielectric material. Hence, the oxide semiconductor may be present as a layer of a multi-layered gate electrode sidewall spacer to stand-off by 2-10 nm heavily-doped source/drain semiconductor from the channel semiconductor disposed below the gate electrode. In some embodiments, the oxide semiconductor is disposed only between the channel and drain, for an asymmetrical gate sidewall spacer. However, in advantageous embodiments where symmetry of FET 201 (202) is maintained, the oxide semiconductor is disposed between the channel semiconductor and source semiconductor, as well as between the channel semiconductor and drain semiconductor. Such symmetrical architectures allow a drain of one transistor to be employed as a source of another transistor.

Figure 3A:
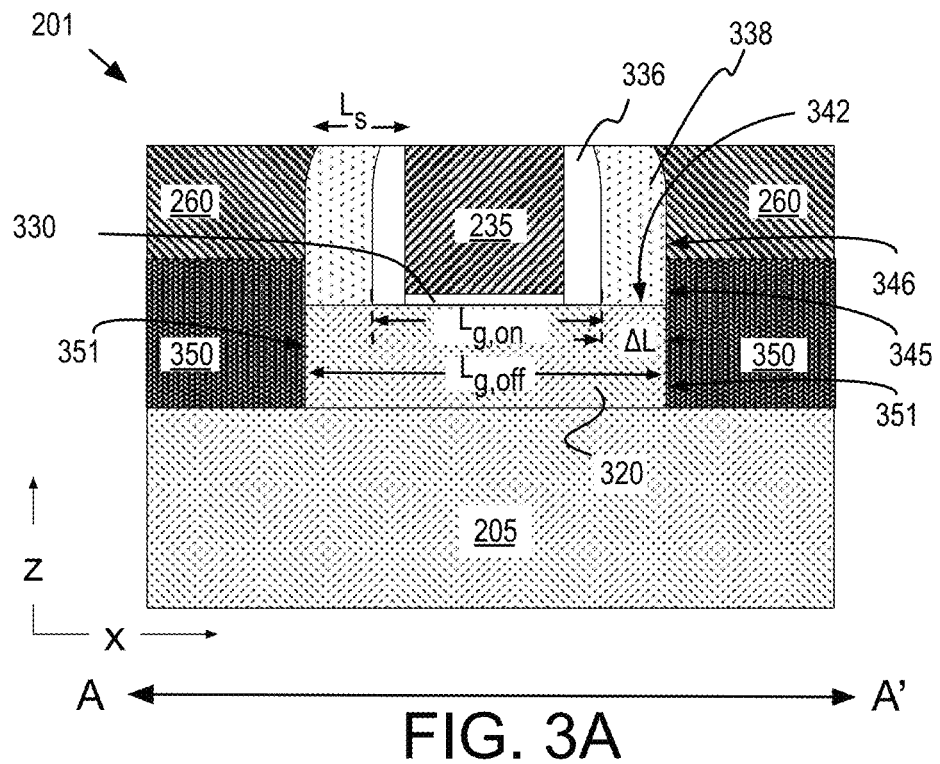
FIG. 3A illustrates a cross-sectional view through a length of channel semiconductor and source/drain semiconductor of the FET depicted in FIG. 2, in accordance with some embodiments.

Transistors 201, 202 may employ a wide variety of transistor channel architectures including planar and non-planar implementations. FIG. 3A illustrates a cross-sectional view through a length of channel semiconductor and source/drain semiconductor of FET 201 along the A-A' plane denoted in FIG. 2, in accordance with some planar channel semiconductor embodiments.

As shown in FIG. 3A, channel semiconductor 320 is disposed between source/drain semiconductor 350. Source/drain semiconductor 350 is heavily-doped with an n-type impurity. Channel semiconductor 320 may be lightly doped with a p-type impurity, or substantially undoped (e.g., intrinsic). In some exemplary embodiments, both source/drain semiconductor 350 and channel semiconductor 320 are non-oxide semiconductors, such as, but not limited to, monocrystalline group IV semiconductors, monocrystalline group III-V semiconductors, or monocrystalline group III-N semiconductors. Group IV semiconductor embodiments may include silicon, germanium, or an alloy thereof. III-V semiconductor embodiments include a first sub-lattice of at least one element from group III of the periodic table (e.g., Al, Ga, In) and a second sub-lattice of at least one element of group V of the periodic table (e.g., P, As, Sb). The III-V compound may be a binary, ternary, or quaternary material. Source/drain semiconductor 350 and channel semiconductor 320 form an interface 351, which may be a homojunction (i.e., of the same majority lattice constituents) or heterojunction (i.e., having different majority lattice constituents). Source/drain semiconductor 350 also forms an interface with substrate 205, which may also be a homojunction or heterojunction. Channel semiconductor 320 may also form an interface with substrate 205, which may be a homojunction (e.g., a p-type epitaxial silicon layer interface with an undoped silicon substrate), or heterojunction (e.g., a Ge layer interface with undoped silicon substrate).

A gate stack including gate electrode 235 and gate dielectric 330 is disposed over channel semiconductor 320. While any known electrode and insulator materials may be utilized in the gate stack, in one exemplary embodiment a high-k material having a bulk relative permittivity of 9, or more, is employed as gate dielectric 330. Exemplary high-k materials include metal oxides, such as, but not limited to $Al_2O_3$, $HfO_2$, $HfAlO_x$, $HfSiO_x$, or $TaSiO_x$ may also be suitable. Gate electrode 235 may be any material that has a work function suitable for a desired channel threshold voltage ($V_t$) as a function of the composition of channel semiconductor 320. Gate electrode 235 may advantageously have a work function below 5 eV. Gate electrode 235 may be a doped semiconductor and/or may include an elemental metal layer, a metal alloy layer, or laminate structure of either or both. In some embodiments the gate electrode is a metal nitride, such as TiN (e.g., 4.0-4.7 eV). The gate electrode may also comprise Al (e.g., TiAlN). Other alloy constituents may also be employed in the gate electrode, such as, but not limited to, C, Ta, W, Pt, and Sn.

In some embodiments illustrated by FIG. 3A, a portion of channel semiconductor 320 is further disposed below (or covered by) a gate electrode sidewall insulator 336 and an oxide semiconductor 338. Sidewall insulator 336 and oxide semiconductor 338 are adjacent to opposite edges or sidewalls of gate electrode 235. When viewed in cross-section oxide semiconductor 338 may be considered to be a "pair of spacers" on opposing sides of the gate stack, however oxide semiconductor 338 may be continuous about the gate stack such that semiconductor 338 illustrated may also be considered a single spacer extending around a continuous sidewall of the gate stack. In the exemplary embodiment illustrated, sidewall insulator 336 and oxide semiconductor 338 form layers of a multi-layer sidewall spacer separating gate electrode 235 from source/drain semiconductor 350 and/or source/drain contact metallization 260 by lateral spacing $L_s$. In the exemplary embodiment illustrated in FIG. 3A, oxide semiconductor 338 forms an interface 345 with source/drain semiconductor 350. Oxide semiconductor 338 also forms an interface 346 with source/drain contact metallization 260. Oxide semiconductor 338 further forms an interface 342 with channel semiconductor 320.

Sidewall insulator 336 is to be operative as a gate dielectric through which oxide semiconductor 338 is to be gated into semiconducting and insulating states. While oxide semiconductor 338 is in a semiconducting state, sidewall insulator 336 is to prevent an electrical short between oxide semiconductor 338 and gate electrode 235. Sidewall insulator 336 may be any dielectric material known to be suitable for capacitively coupling oxide semiconductor 338 to gate electrode 235, such as, but not limited to, one or more layer of silicon oxide, silicon nitride, silicon oxynitride. In some embodiments, sidewall insulator 336 includes a high-k material (e.g., $Al_2O_3$, $HfO_2$, or $HfAlO_x$). In some embodiments, sidewall insulator 336 has the same composition as gate dielectric 330. Sidewall insulator 336 may have a film thickness (e.g., in the x-dimension of FIG. 3A) less than 10 nm, advantageously less than 7 nm, and more advantageously less than 5 nm. Although illustrated in FIG. 3A as having a thickness exceeding that of gate dielectric 330, in some alternative embodiments sidewall insulator 336 has the same film thickness as gate dielectric 330, which may be 1-2 nm, for example. For some implementations therefore, gate dielectric 330 may be further employed as sidewall insulator 336.

Oxide semiconductor 338 may be any composition known to achieve significant carrier density modulation, for example between an intrinsic and a semiconducting (e.g., n-type) state, responsive to a gate voltage signal of a magnitude suitable for MOSFET operation. Oxide semiconductor 338 may be an oxide of any of the materials introduced above (e.g., IUPAC group 4-10 or 11-14). In advantageous embodiments, oxide semiconductor 338 is a metal oxide including at least one of Cu, Zn, Sn, Ti, Ni, Ga, In, Sr, Cr, Co, V, or Mo. In some advantageous embodiments, oxide semiconductor 338 is a tin oxide, such as Tin (IV) oxide, or $SnO_2$. In other embodiments, oxide semiconductor 338 is Tin (II) oxide (SnO) or a mixture of SnO and $SnO_2$, where x may range between 1 and 2. While the range of x may be expanded, semiconducting properties may be lost (e.g., the material becomes a pure conductor if x is to low, and a pure insulator if x is too high). Fermi level of the oxide semiconductor should not be so heavily pinned p-type/n-type that it can't be modulated through the gate electrode field. Tin oxide can be modulated through the field effect to if an interface of suitable quality is formed with sidewall insulator 336. Other oxide semiconductors known to have suitable n-type conductivity, such as, but not limited to, titanium oxide ($TiO_x$) and $ZnO_x$ may substitute for tin oxide. In some embodiments, oxide semiconductor 338 is not intentionally doped and has minimal impurity dopant concentration. Alternatively, oxide semiconductor 338 may be impurity doped (e.g., with a donor impurity for greater n-type conductivity). Exemplary dopants include one or more group III element (e.g., Al, In, Ga to form IGZO), and/or elemental hydrogen (H). Dopant levels in oxide semiconductor 338 may be selected to arrive at optimal threshold voltage associated with gating the oxide semiconductor and/or for lowest bulk and/or junction resistance.

Notably, for a p-type FET (e.g., FET 202 in FIG. 2) an analogous oxide semiconductor having p-type conductivity, such as $CuO_x$, may be substituted for the n-type oxide semiconductor compositions described above. In some $CuO_x$ embodiments, the p-type material is Cu(I) oxide, or $Cu_2O$. In other embodiments, the p-type material is Cu(II) oxide (CuO) or a mixture of CuO and $Cu_2O$, where x may range between 0.5 and 1. Other exemplary p-type oxide semiconductors (e.g., including $NiO_x$ and SnO) may substitute for $CuO_x$.

In some embodiments, interface 346 becomes a metal-semiconductor junction when oxide semiconductor 338 has a high charge carrier density in the semiconducting state. Interface 346 may be a rectifying (i.e., Schottky) contact or resistive (ohmic) contact as a function of the composition of oxide semiconductor 338 and the composition of source/drain contact metallization 260. In some exemplary embodiments where source/drain semiconductor 350 is n-type and source/drain contact metallization 260 forms an ohmic contact to source/drain semiconductor 350, interface 346 is advantageously also an ohmic metal-semiconductor junction. Contact resistance associated with interface 346 may be characterized by a transfer length oriented approximately orthogonal to the gate length $L_g$ associated with gate electrode 235. As such, when in a semiconducting state, oxide semiconductor 338 may increase the effective contact length or area associated with source/drain contact metallization.

For exemplary embodiments where source/drain semiconductor 350 and channel semiconductor 320 are non-oxide semiconductors, interfaces 342 and 345 become n-type semiconductor heterojunctions when oxide semiconductor 338 is in the semiconducting state. Each of these heterojunctions may be associated with a band gap offset dependent on the composition of oxide semiconductor 338, channel semiconductor 320, and source/drain semiconductor 350. Interface 345 may be of low resistance due, at least in part, to heavy dopant concentration in source/drain semiconductor 350. Band gap engineering of one or more of oxide semiconductor 338, channel semiconductor 320, or one or more intervening interfacial materials (not depicted), may be employed to minimize or mitigate any conduction band offset that might otherwise impede carrier transit through interface 342. Interface 342 has a length $\Delta L$ (e.g. in the x-dimension) over which charge carriers may advantageously pass when oxide semiconductor 338 is gated into a semiconducting state. Length $\Delta L$ may vary as a function of the lateral thickness (e.g., in x-dimension) of oxide semiconductor 338 and as a function of lateral overlap (e.g., in x-dimension) between oxide semiconductor 338 and source/drain semiconductor 350. In the embodiment illustrated in FIG. 3A, there is no overlap between oxide semiconductor 338 and source/drain semiconductor 350, and $\Delta L$ is equal to the oxide semiconductor film (or lateral spacer) thickness. For such embodiments, $\Delta L$ may vary between 1 nm and 7 nm, for example. In some embodiments, $L_s$ is 2-7 nm, sidewall insulator is 1-2 nm and oxide semiconductor is 1-5 nm.

Figure 3B:
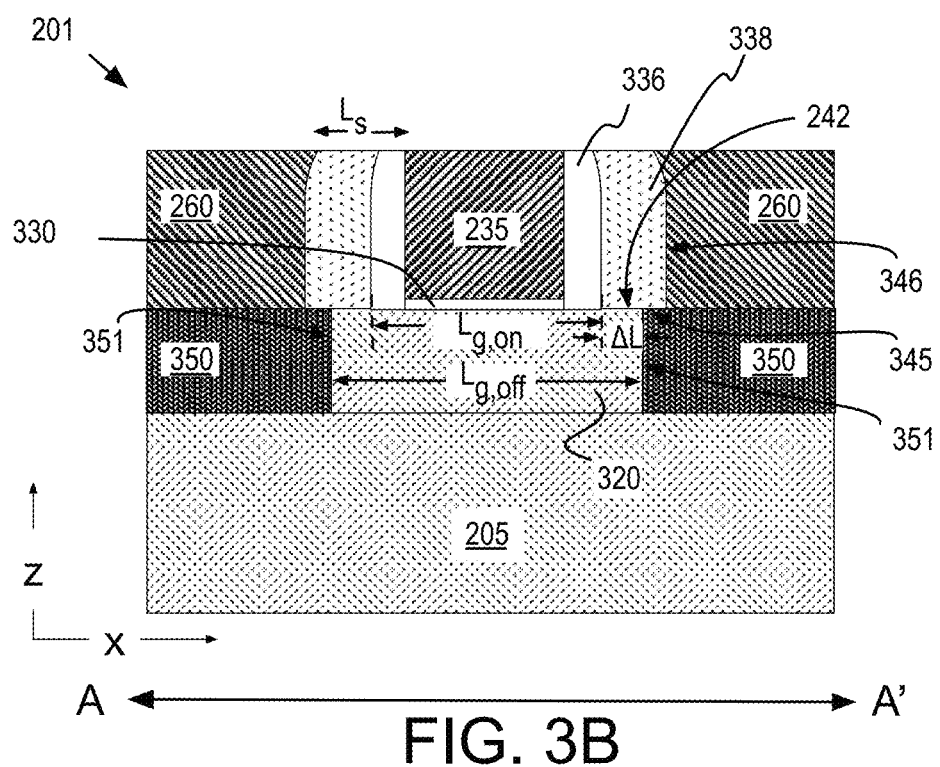
FIG. 3B illustrates a cross-sectional view through a length of channel semiconductor and source/drain semiconductor of the FET depicted in FIG. 2, in accordance with some embodiments.

FIG. 3B illustrates a cross-sectional view through a length of the channel semiconductor and the source/drain semiconductor of FET 201 in accordance with some alternative embodiments where $\Delta L$ is less than the oxide semiconductor film (or lateral spacer) thickness because source/drain semiconductor laterally overlaps oxide semiconductor 338. The portion of source/drain semiconductor 350 overlapping oxide semiconductor 338 may be of a lighter impurity doping (e.g., LDD) than the remainder of source/drain semiconductor 350, or may be heavily-doped in alternative embodiments. FIG. 3B also illustrates an alternative planar source/drain semiconductor 350 in which interface 345 is disposed below oxide semiconductor 338, rather than laterally adjacent to oxide semiconductor 338. For such embodiments, oxide semiconductor 338 forms a first heterojunction with channel semiconductor 320 along a first portion of $\Delta L$ and oxide semiconductor 338 forms a second heterojunction with source/drain semiconductor 350 along a second portion of $\Delta L$.

As noted above, an oxide semiconductor is to be gated between insulating (intrinsic) and semiconducting (e.g., n-type) states. In reference to FIGS. 3A and 3B, with oxide semiconductor 338 being coupled to both channel semiconductor 320 and source/drain semiconductor 350 (and/or contact metallization 260), oxide semiconductor 338 may function to effectively reduce carrier transit distances between the source and drain when oxide semiconductor 338 is gated into the semiconducting state.

Figure 3C:
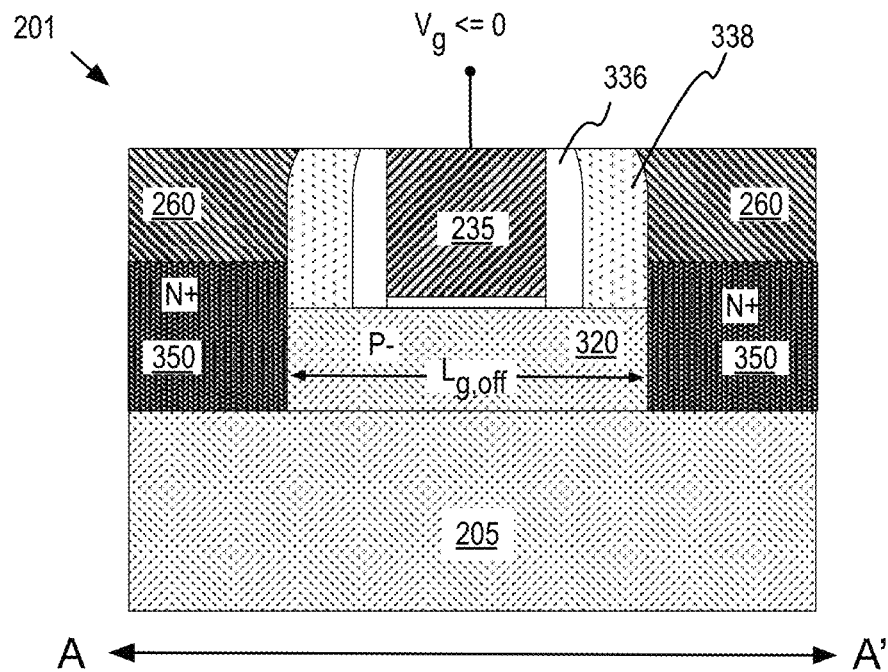
FIG. 3C illustrates a cross-sectional view through a length of channel semiconductor and source/drain semiconductor of the FET depicted in FIG. 3A while in an off-state, in accordance with some embodiments.
Figure 3D:
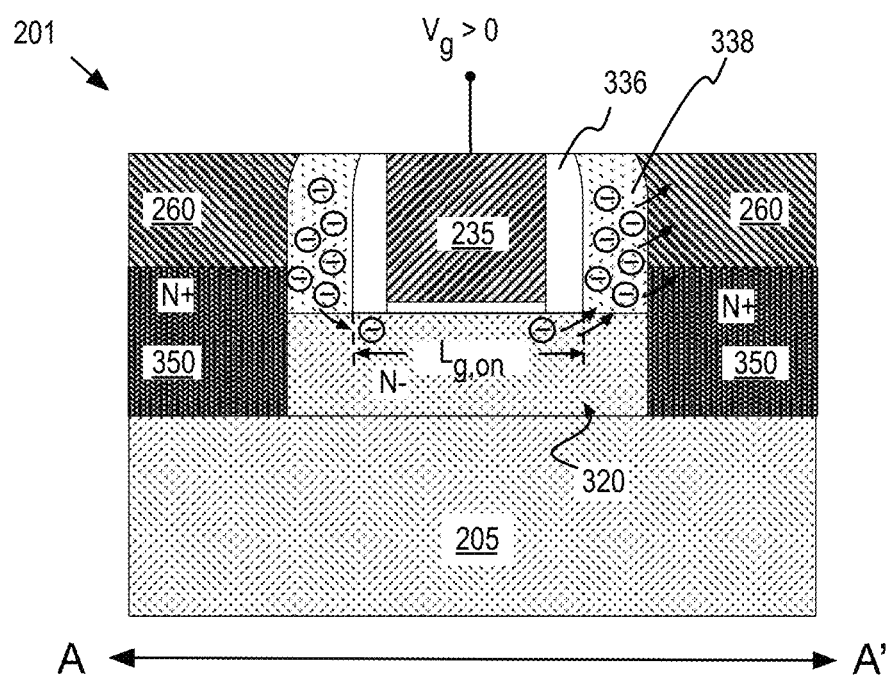
FIG. 3D illustrates a cross-sectional view through a length of channel semiconductor and source/drain semiconductor of the FET depicted in FIG. 3A while in an on-state, in accordance with some embodiments.

FIG. 3C illustrates a cross-sectional view through a length of channel semiconductor and source/drain semiconductor of the FET depicted in FIG. 3A while in an off-state, in accordance with some embodiments. FIG. 3D illustrates a cross-sectional view through a length of channel semiconductor and source/drain semiconductor of the FET depicted in FIG. 3A while in an on-state, in accordance with some embodiments. In FIG. 3C where gate electrode bias voltage zero or negative, oxide semiconductor 338 is in an intrinsic, low conductivity state. With a low carrier density, electrically insulative properties of oxide semiconductor 338 supplement those of sidewall dielectric 336. Together, the two materials function as an electrically insulating, dual-layer gate electrode sidewall spacer. As further shown in FIG. 3D, in response to a positive gate electrode bias voltage, carrier density within oxide semiconductor 338 increases and n-type conductive properties of oxide semiconductor 338 supplement those of source/drain semiconductor 350. Together, the two materials function as a dual layer source and/or drain semiconductor structure (e.g., with two charge carrier densities). Majority charge carriers may then transit from channel semiconductor 320 through oxide semiconductor 338.

As illustrated in FIG. 3C-3D, gating of oxide semiconductor 338 is advantageously tuned to have a threshold voltage compatible with that of the non-oxide channel semiconductor 320. For example, in FIG. 3C channel semiconductor has p-conductivity while oxide semiconductor 338 is depleted of carriers in response to gate bias voltages no greater than 0V. In response, source/drain semiconductor 350 is separated by a gate length of $L_{g,off}$. The effective channel length is then long, reducing off-state leakage and reducing overlap capacitance between gate electrode 235 and source/drain semiconductor 350 and/or source/drain contact metallization 260. In FIG. 3D, channel semiconductor 320 transitions into inversion with n-type conductivity while oxide semiconductor 338 experiences a large increase in charge carriers (electrons). A majority charge carrier may then traverse a gate length of $L_{g,on}$ and enter oxide semiconductor 338. Hence, the charge carrier density is to be sufficient to convey a current between the channel semiconductor and at least one of the source and drain semiconductor when the voltage on the gate electrode is sufficient to induce inversion in at least a portion of the channel semiconductor spanning a distance between the oxide semiconductor 338 disposed on either side of gate electrode 235. The effective channel length is then short, reducing the on-state resistance associated with lateral spacing between gate electrode 235 and source/drain metallization 260 and/or semiconductor 350, particularly for embodiments lacking source/drain LDD tip extensions. The presence of oxide semiconductor 338 may thereby be gated into providing a carrier conduction path that shunts and/or supplements carrier conduction through channel semiconductor 320 and/or any lightly doped source/drain semiconductor disposed below oxide semiconductor 338 for a $\Delta L$ modulation in effective $L_g$.

Figure 4A:
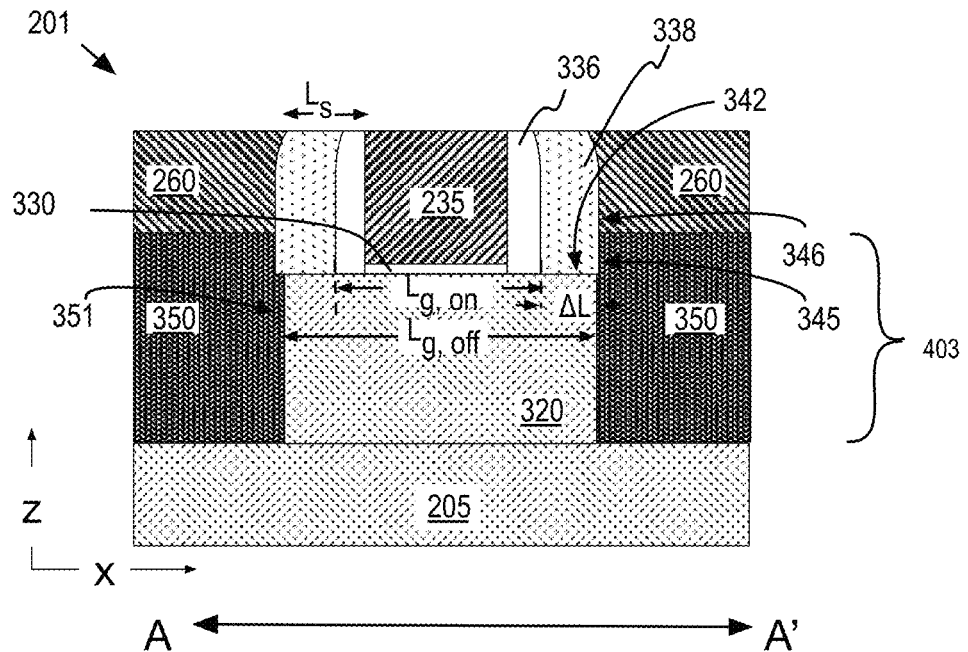
FIG. 4A illustrates a cross-sectional view through a length of channel semiconductor and source/drain semiconductor of the FET depicted in FIG. 2, in accordance with some alternative embodiments.
Figure 4B:
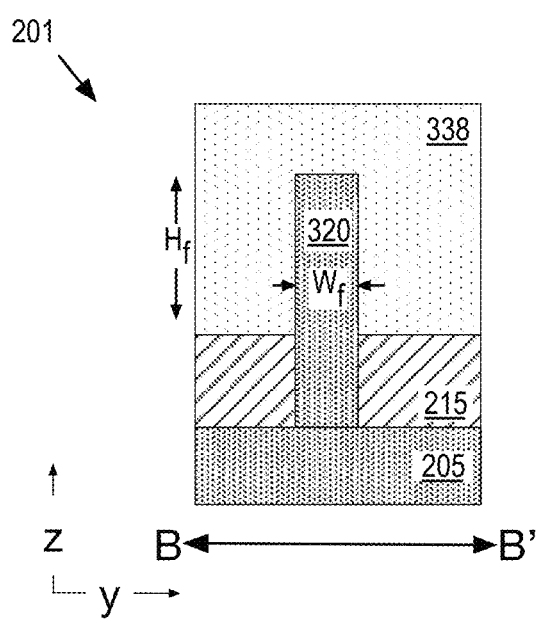
FIG. 4B illustrates a cross-sectional view through a fin width within an oxide semiconductor spacer of the FET depicted in FIG. 4A, in accordance with some embodiments.

In some exemplary embodiments, FETS 201, 202 include a semiconductor fin. Such non-planar embodiments may employ a single fin material, as illustrated in FIG. 4A, 4B. Alternative non-planar embodiments may employ a heterojunction fin ("hetero-fin") structure that further includes a first semiconductor material disposed on a "sub-fin" of a second semiconductor material, as further illustrated in FIG. 5A, 5B.

FIG. 4A illustrates a cross-sectional view through a length of channel semiconductor and source/drain semiconductor of FET 201 along the A-A' plane denoted in FIG. 2, in accordance with some finFET embodiments. FIG. 4B illustrates a cross-sectional view through a fin width surrounded by a gated oxide semiconductor spacer along the B-B' plane denoted in FIG. 2, in accordance with some embodiments. All the structures introduced in FIG. 3A in the context of a planer FET are present in the exemplary finFET embodiment illustrated in FIG. 4A. As further shown in FIG. 4B, channel semiconductor 320 is non-planar having opposite sidewalls defining a fin width $W_f$ and having a fin height $H_f$ extending above isolation dielectric 225. Oxide semiconductor 338 is in direct contact with the fin sidewalls along the B-B' plane laterally adjacent to the gate electrode.

Figure 5A:
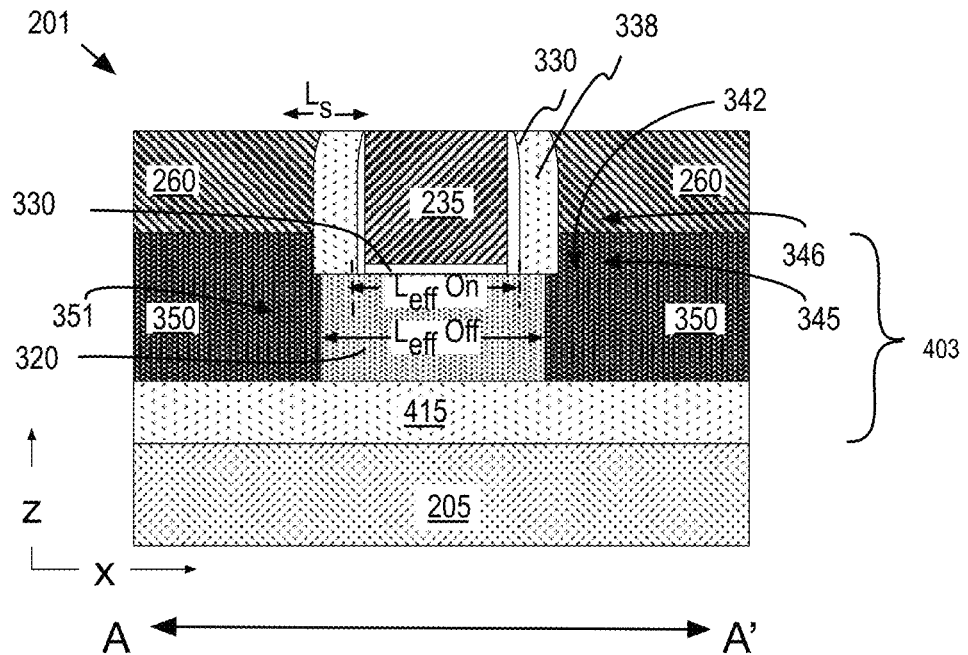
FIG. 5A illustrates a cross-sectional view through a length of channel semiconductor and source/drain semiconductor of the FET depicted in FIG. 2, in accordance with some alternative embodiments.
Figure 5B:
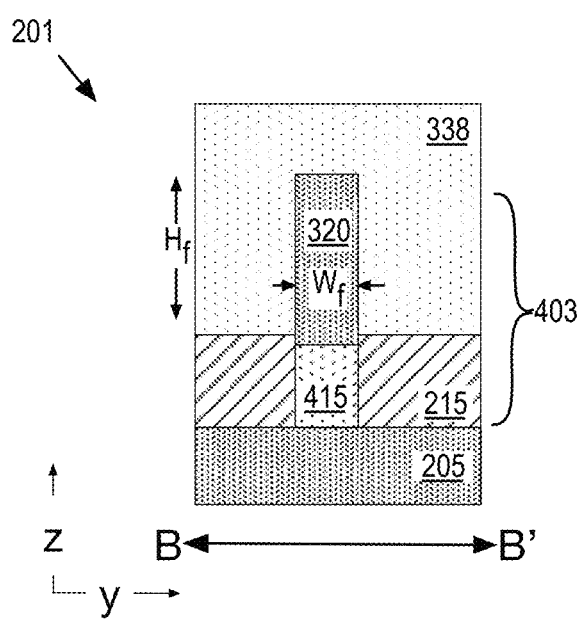
FIG. 5B illustrates a cross-sectional view through a fin width and an oxide semiconductor spacer of the FET depicted in FIG. 5A, in accordance with some embodiments.

In FIGS. 5A and 5B, a hetero-fin 403 includes channel semiconductor 320 disposed on a sub-fin 415. Sub-fin 415 is embedded in isolation dielectric 225 (FIG. 5B). Channel semiconductor 320 is of a first material while sub-fin 415 is of a second semiconductor material. The two different materials form a channel/sub-fin heterojunction. In some exemplary embodiments where sub-fin 415 does not to serve as part of the device channel, sub-fin 415 need not be of a material having high electron mobility. In some advantageous embodiments, sub-fin 415 is a second material of suitable composition so that the fin heterojunction is associated with an energy band offset between the channel semiconductor 320 and sub-fin 415 useful for reducing a substrate leakage current path through sub-fin 415. In some N-type transistor embodiments where channel semiconductor 320 is to provide an electron channel, sub-fin 415 may have a higher conduction band energy (i.e., a carrier-blocking conduction band offset) than that of channel semiconductor 320.

In some embodiments, sub-fin 415 and channel semiconductor 320 are different monocrystalline group IV semiconductors (e.g., a Ge channel semiconductor on a silicon or GaAs sub-fin). In some alternative embodiments, sub-fin 415 and channel semiconductor 320 are each monocrystalline compound semiconductors with a first sub-lattice of at least one element from group III of the periodic table (e.g., Al, Ga, In), and a second sub-lattice of at least one element of group V of the periodic table (e.g., P, As, Sb). Sub-fin 415 and channel semiconductor 320 may each be a binary, ternary, or quaternary III-V compound semiconductor that is an alloy of two, three, or even four elements from groups III and V of the periodic table. For exemplary N-type transistor embodiments, channel semiconductor 320 is advantageously a III-V material having a high electron mobility, such as, but not limited to GaAs, InGaAs, InP, InSb, and InAs. For some $In_xGa_{1-x}As$ fin channel semiconductor embodiments, In context, x, between 0.1 and 0.9, and advantageously at least 0.5 (e.g., $In_{0.53}Ga_{0.47}As$). Sub-fin 415 is advantageously a III-V material having a significant carrier-blocking band offset (e.g., conduction band offset) from that of the fin material, such as but not limited to GaAs, GaSb, GaAsSb, GaP, InAlAs, GaAsSb, AlAs, AlP, AlSb, and AlGaAs. In some N-type transistor embodiments, sub-fin 415 has a higher conduction band energy and is also doped with p-type impurities (e.g., Mg, Be, etc.). FIG. 5A further illustrates embodiments where oxide semiconductor 338 is separated from gate electrode 235 by gate dielectric 330 as the only intervening insulator through which oxide semiconductor 338 is gated.

Figure 6:
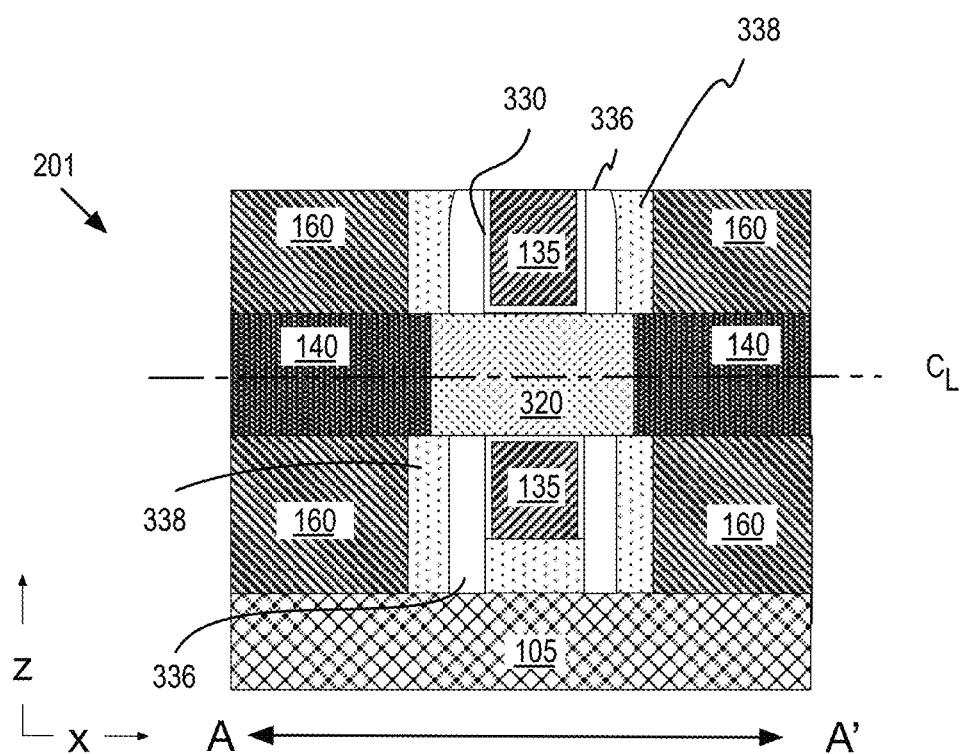
FIG. 6 illustrates a cross-sectional view through a length of channel semiconductor and source/drain semiconductor of a FET, in accordance with some alternative nanowire embodiments.

FIG. 6 depicts FET 201 in accordance with some exemplary nanowire embodiments. The nanowire FET may have substantially the same layout/footprint as illustrated in FIG. 2. The nanowire FET embodiments however have a gate stack and source/drain semiconductor that wraps completely around channel semiconductor 320. Gate electrode sidewall insulator 336 and oxide semiconductor 338 also wrap completely around channel semiconductor 320. As shown, oxide semiconductor 338 is substantially symmetrical about a longitudinal axis $CL$, of channel semiconductor 320. FIG. 6 further illustrates embodiments where oxide semiconductor 338 is separated from gate electrode 235 by both gate dielectric 330 sidewall insulator 336.

Figure 7:
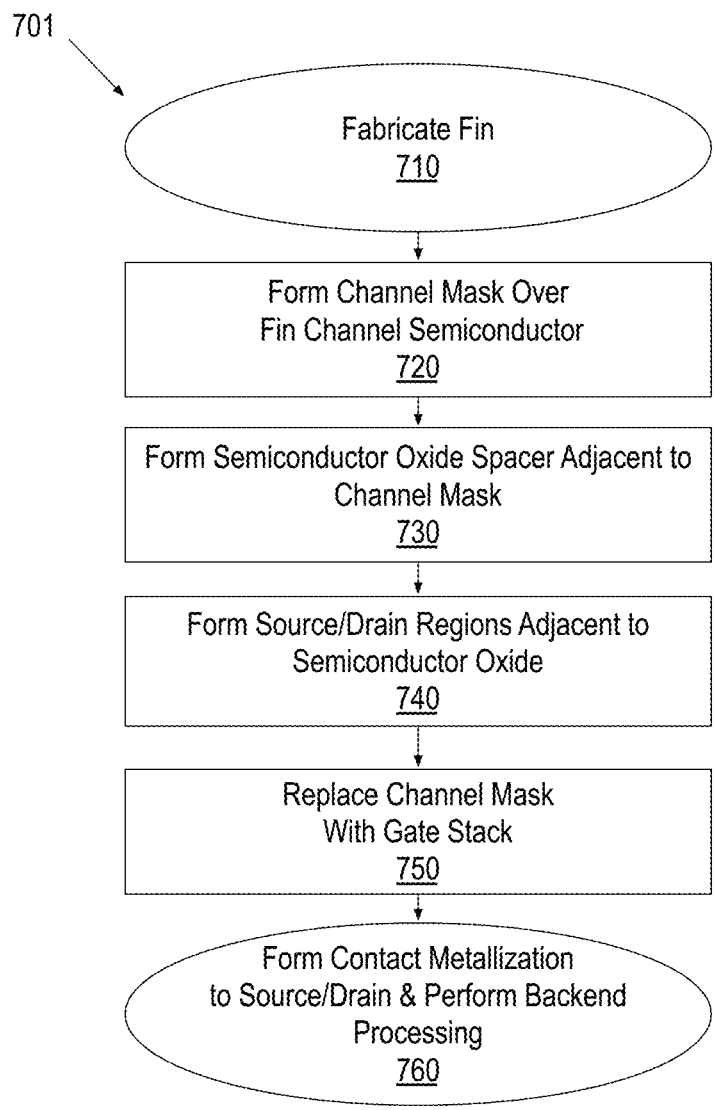
FIG. 7 is a flow diagram illustrating a method of fabricating a finFET with a gated oxide semiconductor spacer, in accordance with some embodiments.

FETs with a gated oxide semiconductor in accordance with the architectures above may be fabricated by a variety of methods applying a variety of techniques and processing chamber configurations. FIG. 7 is a flow diagram illustrating an exemplary method 701 for fabricating a finFET with an oxide semiconductor gate electrode spacer, in accordance with some embodiments. FIGS. 8A, 9A, 10A, 11A, and 12A illustrate cross-sectional views along the A-A' plane of finFET 201 evolving as the method 701 is performed, in accordance with some hetero-fin embodiments. FIGS. 8B, 9B, 10B, 11B, and 12B illustrate cross-sectional views along the B-B' plane of finFET 201 evolving as the method 701 is performed, in accordance with some hetero-fin embodiments. Although hetero-fin fabrication is illustrated, aspects pertaining to the oxide semiconductor gate electrode spacer are also applicable to less complex planar and non-planar FETs.

Referring first to FIG. 7, method 701 begins at operation 710 where a fin of semiconductor material is formed. In some embodiments, a III-V hetero-fin is fabricated, for example by epitaxially growing numerous islands of III-V material over a silicon substrate having a plurality of seeding surfaces. In some such embodiments, seeding surfaces are surrounded by high aspect ratio sidewalls to practice aspect ratio trapping (ART) and achieve acceptable crystal quality in the heteroepitaxial fin material. The ART technique is one example of local additive heteroepitaxial fin fabrication, which may advantageously reduce the effects of lattice mismatch across various heterojunctions. In alternative embodiments, a conventional subtractive technique may be employed in which a blanket III-V film stack is grown over, or transferred to, a working surface of a substrate. That blanket III-V film stack is then etched into fin structures similarly amenable to subsequent operations of method 701.

Figures 8A, 8B:
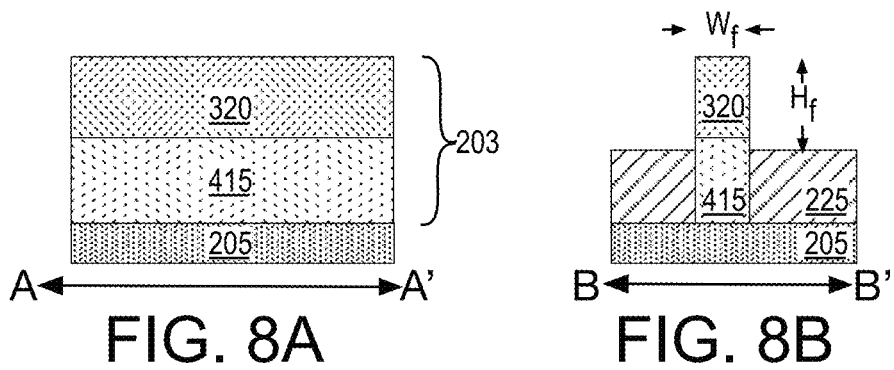

In the exemplary embodiments illustrated by FIGS. 8A and 8B, upon completion of operation 710, hetero-fin 203 is disposed on substrate 205 with at least a portion of channel semiconductor 320 extending a z-height $H_f$ above a surrounding sub-fin isolation 225. In some embodiments, z-height $H_f$ is defined by recess etching a predetermined amount of sub-fin isolation material 225 from around hetero-fin 203. Z-height $H_f$ may vary with the extent of recess etch, potentially exposing sidewalls of sub-fin 415. In alternate embodiments, a stop layer may be utilized to ensure a top surface of sub-fin isolation 225 is flush with the heterojunction between sub-fin 415 and channel semiconductor 320. At this point, transverse fin width $W_f$ is substantially constant along the entire longitudinal length of a fin.

Returning to FIG. 7, method 701 continues at operation 720 where a channel mask is patterned to protect a portion of the semiconductor fin that is to be the channel semiconductor. While any known masking technique and material(s) may be employed at operation 720, in some embodiments, the channel mask is a gate mandrel retained through a number of processes until being replaced in a "gate-last" finFET fabrication flow.

Figures 9A, 9B:
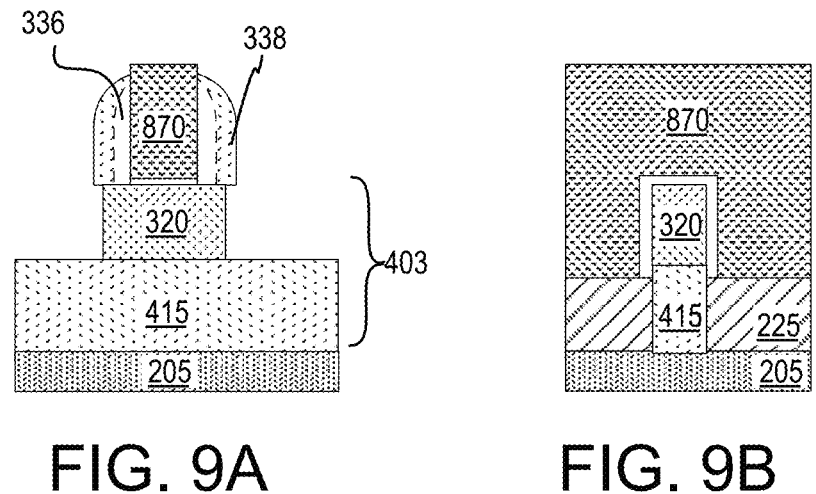

In the exemplary embodiment illustrated in FIGS. 9A and 9B, a sacrificial gate 870 is formed over a portion of the hetero-fin 403. Any known sacrificial gate structure and fabrication techniques may be employed at operation 720 to form sacrificial gate 870 on at least two opposing sidewalls of fin 320 (FIG. 9A). Sacrificial gate 870 is patterned into a stripe of sacrificial material extending over channel semiconductor 320 and landing on sub-fin isolation 225. Other portions of hetero-fin 203 are exposed. In further embodiments represented by FIG. 9A, the channel mask formed at operation 720 further includes a self-aligned lateral spacer process that forms oxide semiconductor 338 in direct contact with either sacrificial gate 870 or a gate sidewall insulator 336. In FIG. 9A, gate sidewall insulator 336 is shown in dashed line as optional. Oxide semiconductor thin films may be deposited by a variety of known techniques. Deposition temperatures are advantageously low for amorphous oxide semiconductor embodiments. In some embodiments, the oxide semiconductor is conformally deposited over fin 403 and sacrificial gate 870 with a chemical vapor deposition or atomic layer deposition process. An anisotropic etch is then employed to clear the oxide semiconductor film except along edges of the sacrificial gate topography.

In some embodiments, the channel mask further includes gate sidewall insulator 336 formed adjacent to sidewalls of sacrificial gate 870. If formed, gate sidewall insulator 336 is to be deposited and etched back prior to formation of the oxide semiconductor spacer. Any conventional self-aligned lateral spacer process may be employed to form gate sidewall insulator 336. For example, a dielectric (e.g., silicon dioxide and/or silicon nitride, etc.) may be conformally deposited over the fin and over the sacrificial gate 870. An anisotropic etch is then employed to clear the dielectric film except along edges of the sacrificial gate topography.

Returning to FIG. 7, method 701 proceeds to operation 740 where source/drain semiconductors are formed. Both composition and in-situ doping may be modulated to grow a desired source/drain semiconductor. Any of metal-organic chemical vapor deposition (MOCVD), molecular beam epitaxy (MBE), hydride vapor phase epitaxy (HVPE), or the like, may be employed to grow source/drain semiconductor. In some embodiments, portions of the fin not protected by the channel mask or sub-fin isolation may be recess etched prior to epitaxial overgrowth of source/drain semiconductor. In the example illustrated by FIG. 9A, portions fin 320 not protected by the channel mask or sub-fin isolation 225 have been recessed etched. This recess etch may laterally undercut oxide semiconductor 338 by some predetermined amount, or not. The recess etch may employ a crystallographic wet etchant or a low damage, chemical dry etchant, for example. In some embodiments, unprotected portions of semiconductor 320 are recess etched selectively to sub-fin 415.

Figures 10A, 10B:
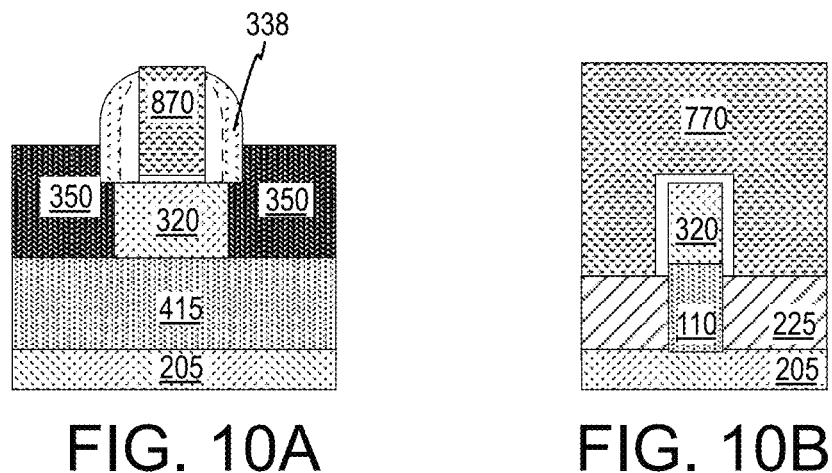

FIG. 10A illustrates source/drain semiconductor 350 epitaxially grown on surfaces of the fin not protected by the channel mask or oxide semiconductor. As further shown in FIG. 10B, oxide semiconductor 338 is present during source/drain growth, setting the lateral spacing between a gate stack and source/drain semiconductor. Any known epitaxial source/drain regrowth technique may be employed. In exemplary embodiments illustrated in FIG. 10A, a single crystalline heteroepitaxial source/drain semiconductor 350 is grown. The regrown source/drain material may be heavily in-situ doped (e.g., n-type).

Returning to FIG. 7, method 701 continues at operation 750 where the channel mask is replaced with a permanent gate stack. Method 701 is then substantially completed with any suitable source/drain (contact) metallization and back-end processing performed at operation 760. For the exemplary embodiment further illustrated in FIG. 11A, 11B, finFET isolation dielectric 280 is deposited and planarized to expose a top of sacrificial gate 870. Sacrificial gate 870 is removed selectively relative to isolation dielectric 280 and oxide semiconductor 338, thereby exposing the channel semiconductor 320. A permanent gate stack including a gate dielectric 330 and gate electrode 235 is deposited into the void formed by removal of the sacrificial gate. While any known gate stack materials may be utilized, in one exemplary embodiment a high-k dielectric material is deposited along with a metal gate electrode. As further illustrated in FIG. 12A, source/drain contact metallization 250 is formed by any known technique (e.g., Ti/TiN deposition). As shown in FIG. 12B, oxide semiconductor 338 is retained, defining the lateral spacing between the gate stack and source/drain contact metallization. The structure of FET 201 is then substantially as introduced in FIG. 2 and FIGS. 3A-3D, and is ready for backend processing by known techniques.

Figure 13:
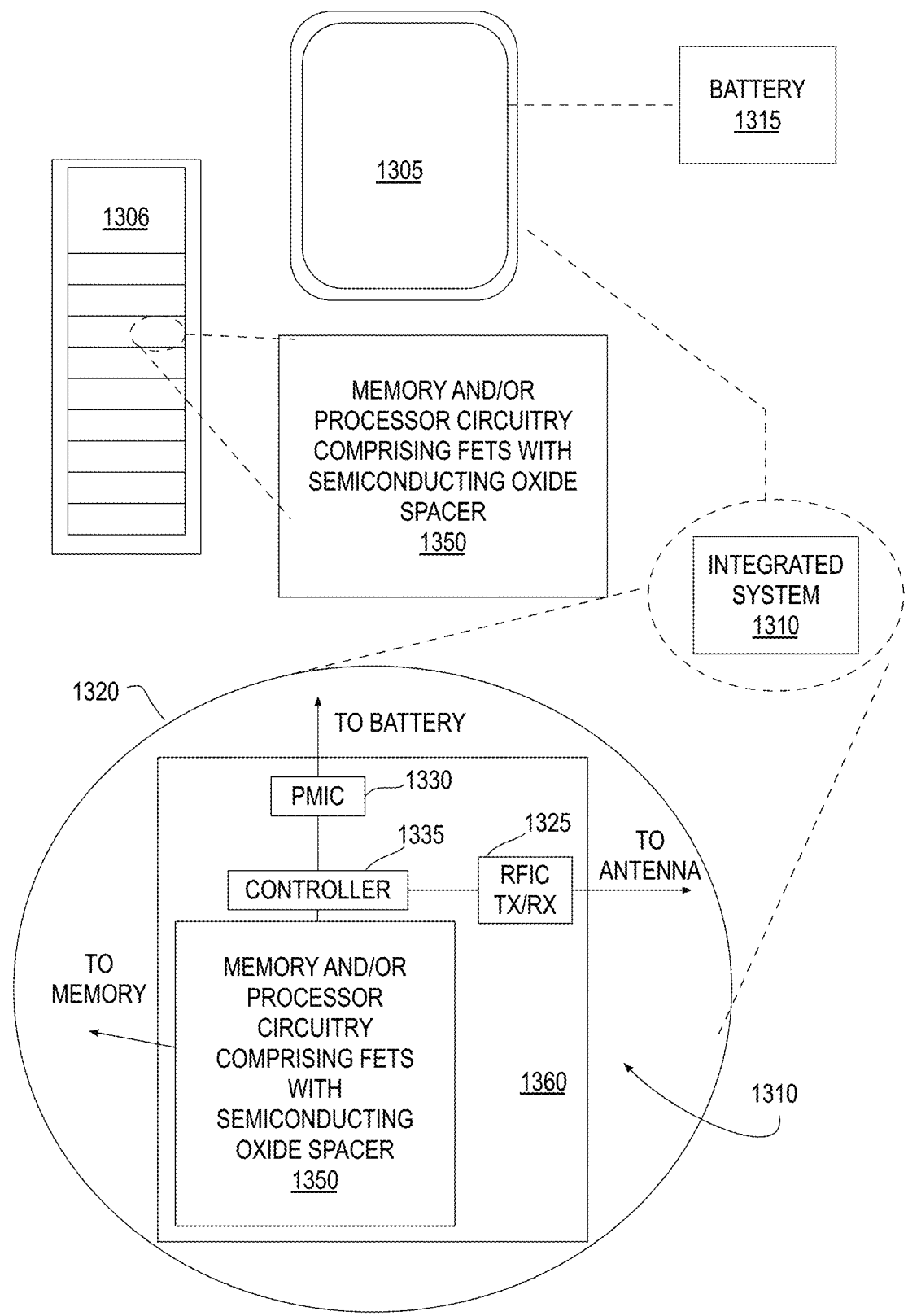
FIG. 13 illustrates a mobile computing platform and a data server machine employing an SoC having a plurality of FETs including a gated oxide semiconductor source/drain spacer, in accordance with embodiments.

FIG. 13 illustrates a mobile computing platform and a data server machine employing an SoC including FETs with an oxide semiconductor spacer, for example as described elsewhere herein. The server machine 1306 may be any commercial server, for example including any number of high-performance computing platforms disposed within a rack and networked together for electronic data processing, which in the exemplary embodiment includes a packaged monolithic SoC 1350. The mobile computing platform 1305 may be any portable device configured for each of electronic data display, electronic data processing, wireless electronic data transmission, or the like. For example, the mobile computing platform 1305 may be any of a tablet, a smart phone, laptop computer, etc., and may include a display screen (e.g., a capacitive, inductive, resistive, or optical touchscreen), a chip-level or package-level integrated system 1310, and a battery 1315.

Either disposed within the integrated system 1310 illustrated in the expanded view 1320, or as a stand-alone packaged chip within the server machine 1306, monolithic SoC 1350 includes a memory block (e.g., RAM), a processor block (e.g., a microprocessor, a multi-core microprocessor, graphics processor, or the like) including at least one n-type FET with an oxide semiconductor spacer, for example as described elsewhere herein. The monolithic SoC 1350 may be further coupled to a board, a substrate, or an interposer 1360 along with, one or more of a power management integrated circuit (PMIC) 1330, RF (wireless) integrated circuit (RFIC) 1325 including a wideband RF (wireless) transmitter and/or receiver (TX/RX) (e.g., including a digital baseband and an analog front end module further comprises a power amplifier on a transmit path and a low noise amplifier on a receive path), and a controller 1335.

Functionally, PMIC 1330 may perform battery power regulation, DC-to-DC conversion, etc., and so has an input coupled to battery 1315 and with an output providing a current supply to other functional modules. As further illustrated, in the exemplary embodiment, RFIC 1325 has an output coupled to an antenna (not shown) to implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 4G, and beyond. In alternative implementations, each of these board-level modules may be integrated onto separate ICs or integrated into monolithic SoC 1350.

Figure 14:
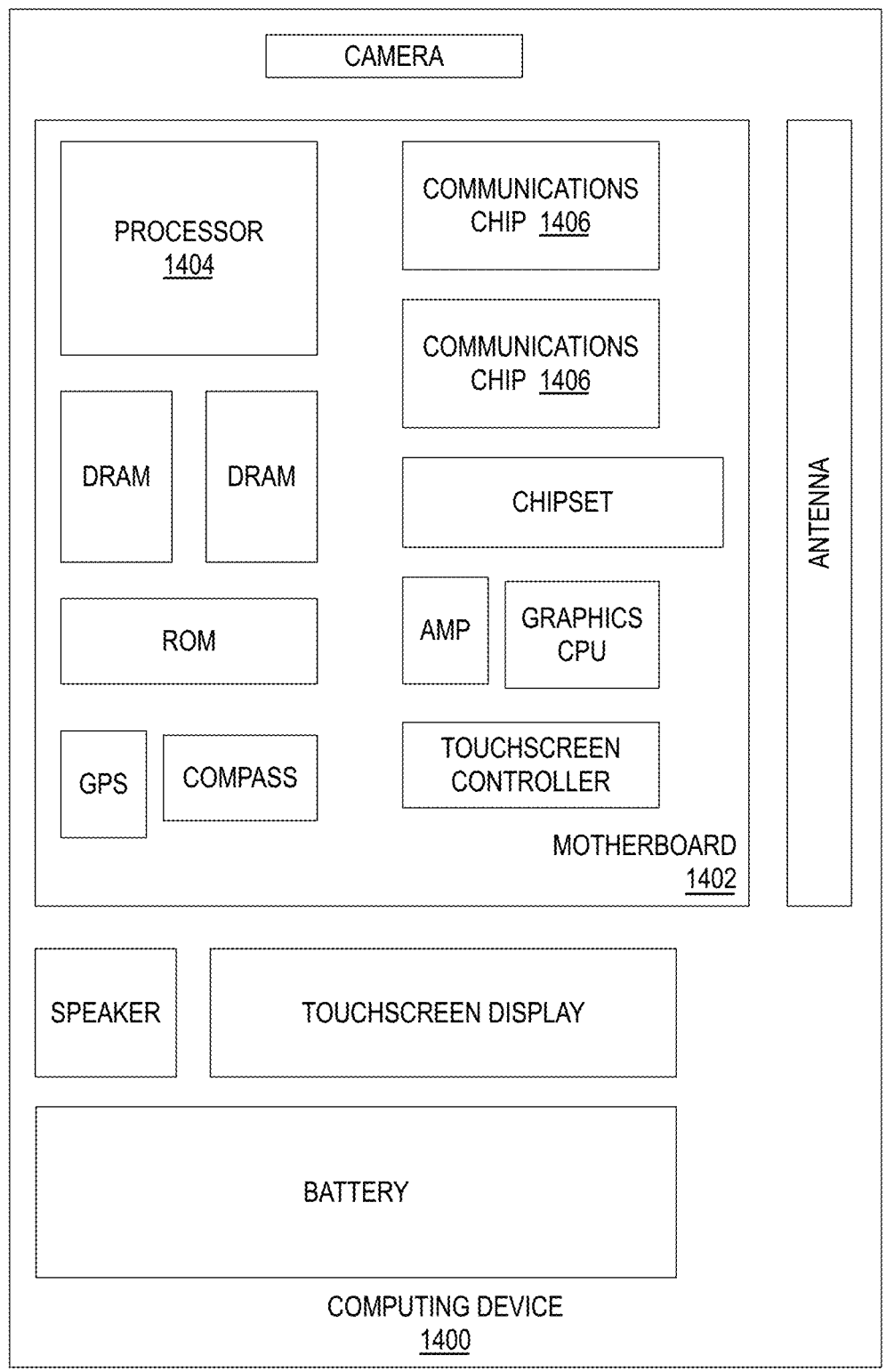
FIG. 14 is a functional block diagram of an electronic computing device, in accordance with some embodiments.

FIG. 14 is a functional block diagram of an electronic computing device, in accordance with some embodiments. Computing device 1400 may be found inside platform 1305 or server machine 1306, for example. Device 1400 further includes a motherboard 1402 hosting a number of components, such as, but not limited to, a processor 1404 (e.g., an applications processor), which may further incorporate at least one FET with an oxide semiconductor spacer, for example as described elsewhere herein. Processor 1404 may be physically and/or electrically coupled to motherboard 1402. In some examples, processor 1404 includes an integrated circuit die packaged within the processor 1404. In general, the term "processor" or "microprocessor" may refer to any device or portion of a device that processes electronic data from registers and/or memory to transform that electronic data into other electronic data that may be further stored in registers and/or memory.

In various examples, one or more communication chips 1406 may also be physically and/or electrically coupled to the motherboard 1402. In further implementations, communication chips 1406 may be part of processor 1404. Depending on its applications, computing device 1400 may include other components that may or may not be physically and electrically coupled to motherboard 1402. These other components include, but are not limited to, volatile memory (e.g., DRAM), non-volatile memory (e.g., ROM), flash memory, a graphics processor, a digital signal processor, a crypto processor, a chipset, an antenna, touchscreen display, touchscreen controller, battery, audio codec, video codec, power amplifier, global positioning system (GPS) device, compass, accelerometer, gyroscope, speaker, camera, and mass storage device (such as hard disk drive, solid-state drive (SSD), compact disk (CD), digital versatile disk (DVD), and so forth), or the like.

Communication chips 1406 may enable wireless communications for the transfer of data to and from the computing device 1400. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chips 1406 may implement any of a number of wireless standards or protocols, including but not limited to those described elsewhere herein. As discussed, computing device 1400 may include a plurality of communication chips 1406. For example, a first communication chip may be dedicated to shorter-range wireless communications, such as Wi-Fi and Bluetooth, and a second communication chip may be dedicated to longer-range wireless communications such as GPS, EDGE, GPRS, CDMA, WiMAX, LTE, Ev-DO, and others.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

It will be recognized that principles of the disclosure are not limited to the embodiments so described, but can be practiced with modification and alteration without departing from the scope of the appended claims. For example the above embodiments may include specific combinations of features as further provided below.

In one or more first embodiments, a transistor includes a source region and a drain region in a semiconductor fin, the source and drain regions separated by a channel region. The transistor includes a gate stack over the channel region, the gate stack comprising a gate dielectric layer and at least one gate electrode layer. The transistor includes a spacer adjacent to a side of the gate stack, the spacer comprising an oxide semiconductor.

In furtherance of the first embodiment, the transistor further comprises a contact metallization disposed on the source and drain region, and the oxide semiconductor is disposed between the gate electrode and at least one of the source region, drain region, or contact metallization. In furtherance of the first embodiments, the oxide semiconductor has a charge carrier density that varies as a function of a voltage on the gate electrode.

In furtherance of the first embodiments, the charge carrier density is sufficient to convey a current between the channel semiconductor and at least one of the source and drain region when the voltage on the gate electrode is sufficient to induce inversion within the first portion of the channel region.

In furtherance of the first embodiments, the oxide semiconductor has a conductivity type that is the same as that of the source and drain regions.

In furtherance of the first embodiments immediately above, the source region and drain region have n-type conductivity type, and the oxide semiconductor has n-type conductivity in the presence of a positive voltage on the gate electrode.

In furtherance of the first embodiments, the oxide semiconductor forms an interface with both the channel region and at least one of the source region and drain region.

In furtherance of the first embodiments immediately above, the oxide semiconductor is separated from the gate electrode by an intervening dielectric material.

In furtherance of the first embodiments immediately above, the intervening dielectric material further comprises the gate dielectric.

In furtherance of the first embodiments, the source and drain regions are both laterally spaced apart from a sidewall of the gate electrode by a length of the oxide semiconductor. The oxide semiconductor forms a first heterojunction with the channel region along at least a portion of the oxide semiconductor length. The oxide semiconductor forms a second heterojunction with the source and drain regions.

In furtherance of the first embodiments immediately above, the oxide semiconductor forms a first heterojunction with the channel region along a first portion of the length and the oxide semiconductor forms a second heterojunction with the source region and drain region along a second portion of the length.

In furtherance of the first embodiments, the oxide semiconductor makes direct contact with the contact metal.

In furtherance of the first embodiments, the oxide semiconductor is a metal oxide including at least one of Cu, Zn, Sn, Ti, Ni, Ga, In, Sr, Cr, Co, V, or Mo.

In furtherance of the first embodiments immediately above, the oxide semiconductor is selected from the group consisting of: tin oxide, zinc oxide, and titanium oxide.

In furtherance of the first embodiments immediately above, the oxide semiconductor comprises IGZO.

In furtherance of the first embodiments, the channel region is an elemental or alloyed group IV semiconductor, or an alloyed group III-V semiconductor.

In furtherance of the first embodiments, the channel region, source region, and drain region are monocrystalline.

The oxide semiconductor is amorphous or polycrystalline. The gate dielectric comprises a high-k dielectric material. The gate electrode comprises a metal gate electrode.

In one or more second embodiments, a CMOS integrated circuit (IC) comprises an n-type fin field effect transistor (finFET) disposed over a first region of a substrate. The CMOS IC comprises a p-type finFET disposed over a second region of the substrate. The n-type finFET further includes an n-type source semiconductor and an n-type drain semiconductor coupled to a channel semiconductor fin disposed there between. The n-type finFET further includes a gate stack including a gate electrode and a gate dielectric disposed over the channel semiconductor fin. The n-type finFET further includes an n-type oxide semiconductor disposed between the gate electrode and at least one of the source semiconductor and drain semiconductor.

In furtherance of the second embodiments, the p-type finFET further comprises a p-type source semiconductor and a p-type drain semiconductor coupled to a second channel semiconductor fin, a second gate electrode stack including a gate electrode and a gate dielectric disposed over the channel semiconductor fin, and a p-type oxide semiconductor disposed between the second gate electrode and at least one of the p-type source semiconductor and p-type drain semiconductor.

In furtherance of the second embodiments immediately above, the p-type oxide semiconductor comprises a copper oxide.

In one or more third embodiments, a method of fabricating a field effect transistor (FET) comprises forming a channel semiconductor over a substrate. The method comprises forming a gate stack over the channel semiconductor, the gate stack including a gate electrode and a gate dielectric. The method comprises depositing an oxide semiconductor over the channel semiconductor. The method comprises etching the oxide semiconductor to retain an oxide semiconductor spacer adjacent to a sidewall of the gate stack. The method comprises forming a source semiconductor and a drain semiconductor over the substrate and adjacent to the oxide semiconductor spacer.

In furtherance of the third embodiments, forming the gate stack further comprises forming a mask over the channel semiconductor and replacing at least a portion of the mask with the gate electrode stack after forming the source and drain semiconductor. Depositing the oxide semiconductor further comprises depositing the oxide semiconductor over the mask. Etching the oxide semiconductor to form the oxide semiconductor spacer further comprises anisotropically etching the oxide semiconductor to form an oxide semiconductor spacer adjacent to the mask.

In furtherance of the third embodiments immediately above, depositing the oxide semiconductor further comprises depositing an n-type oxide semiconductor by chemical vapor deposition.

In furtherance of the third embodiments, forming the gate stack over the channel semiconductor further comprises depositing the gate dielectric over the channel semiconductor and in direct contact with the oxide semiconductor.

However, the above embodiments are not limited in this regard and, in various implementations, the above embodiments may include the undertaking only a subset of such features, undertaking a different order of such features, undertaking a different combination of such features, and/or undertaking additional features than those features explicitly listed. The scope of the invention should, therefore, be determined with reference to the appended claims, along with the full scope of equivalents to which such claims are entitled.

What is claimed is:

1. A transistor comprising:
   a source region and a drain region separated by a channel region comprising a semiconductor material;
   a gate stack over the channel region, the gate stack comprising a gate dielectric layer and at least one gate electrode layer; and
   a spacer adjacent to a side of the gate stack, the spacer comprising an oxide semiconductor.

2. The transistor of claim 1, further comprising
   a contact metallization disposed on the source and drain region; and
   wherein the oxide semiconductor is disposed between the gate electrode and at least one of the source region, drain region, or contact metallization.

3. The transistor of claim 1, wherein:
   the oxide semiconductor has a charge carrier density that varies as a function of a voltage on the gate electrode.

4. The transistor of claim 3, wherein the charge carrier density is sufficient to convey a current between the channel semiconductor and at least one of the source and drain regions when the voltage on the gate electrode is sufficient to induce inversion in at least a portion of the channel region.

5. The transistor of claim 1, wherein the oxide semiconductor has a conductivity type that
   is the same as that of the source region and drain region.

6. The transistor of claim 5, wherein:
   the source region and drain region have n-type conductivity type; and
   the oxide semiconductor has n-type conductivity in the presence of a positive voltage on the gate electrode.

7. The transistor of claim 1, wherein the oxide semiconductor forms an interface with
   both the channel region and at least one of the source region and drain region.

8. The transistor of claim 1, wherein the oxide semiconductor is separated from the gate
   electrode by an intervening dielectric material.

9. The transistor of claim 8, wherein the intervening dielectric material further comprises the gate dielectric layer.

10. The transistor of claim 7, wherein:
    the source and drain regions are laterally spaced apart from the sidewall of the gate electrode by a length of the oxide semiconductor;
    the oxide semiconductor forms a first heterojunction with the channel region along at least a portion of the length of the oxide semiconductor; and
    the oxide semiconductor forms a second heterojunction with the source and drain regions.

11. The transistor of claim 10, wherein the oxide semiconductor forms a first heterojunction with the channel region along a first portion of the length, and the oxide semiconductor forms a second heterojunction with the source region and drain region along a second portion of the length.

12. The transistor of claim 2, wherein the oxide semiconductor makes direct contact with the contact metal.

13. The transistor of claim 1, wherein the oxide semiconductor is a metal oxide including at least one of Cu, Zn, Sn, Ti, Ni, Ga, In, Sr, Cr, Co, V, or Mo.

14. The transistor of claim 13, wherein the oxide semiconductor comprises a tin oxide, zinc oxide, or titanium oxide.

15. The transistor of claim 13, wherein the oxide semiconductor comprises IGZO.

16. The transistor of claim 13, wherein the channel region comprises an elemental or alloyed group IV semiconductor, or an alloyed group III-V semiconductor.

17. The transistor of claim 1, wherein:
the channel region, source region, and drain region are monocrystalline semiconductor materials;
the oxide semiconductor is amorphous or polycrystalline; and
the gate dielectric comprises a high-k dielectric material.

18. A CMOS integrated circuit (IC), comprising:
an n-type fin field effect transistor (finFET) over a first region of a substrate, the finFET further including:
an n-type source semiconductor and an n-type drain semiconductor coupled to a channel semiconductor therebetween;
a gate stack including a gate electrode and a gate dielectric over the channel semiconductor; and
a spacer adjacent to a side of the gate stack, the spacer comprising an oxide semiconductor; and
a p-type finFET over a second region of the substrate.

19. The CMOS IC of claim 18, wherein the p-type finFET further comprises:
a p-type source semiconductor and a p-type drain semiconductor coupled to a second channel semiconductor;
a second gate stack including a gate electrode and a gate dielectric over the second channel semiconductor; and
a second spacer on a side of the second gate stack, the second spacer comprising a p-type oxide semiconductor.

20. The CMOS IC of claim 19, wherein the p-type oxide semiconductor comprises a copper oxide.

21. A method of fabricating a field effect transistor (FET), the method comprising:
forming a channel semiconductor over a substrate;
forming a gate stack over the channel semiconductor, the gate stack including a gate electrode and a gate dielectric;
depositing an oxide semiconductor over the gate stack;
etching the oxide semiconductor to retain an oxide semiconductor spacer adjacent to a sidewall of the gate stack; and
forming a source semiconductor and a drain semiconductor over the substrate and adjacent to the oxide semiconductor spacer.

22. The method of claim 21, wherein:
forming the gate stack further comprises forming a mask over the channel semiconductor and replacing at least a portion of the mask with the gate electrode stack after forming the source and drain semiconductor;
depositing the oxide semiconductor further comprises depositing the oxide semiconductor over the mask; and
etching the oxide semiconductor to form the oxide semiconductor spacer further comprises anistropically etching the oxide semiconductor to form the oxide semiconductor spacer adjacent to the mask.

23. The method of claim 21, wherein depositing the oxide semiconductor further comprises depositing an n-type oxide semiconductor by chemical vapor deposition.

24. The method of claim 21, wherein forming the gate stack over the channel semiconductor further comprises depositing the gate dielectric over the channel semiconductor and in direct contact with the oxide semiconductor.

* * * * *